United States Patent [19]

Serras-Paulet

[11] 4,303,856

[45] Dec. 1, 1981

[54] CONTROL PUSH-BUTTON DEVICE FOR SWITCHING AN ELECTRONIC OR ELECTRIC CIRCUIT

[76] Inventor: Edouard Serras-Paulet, Casa Nostra-Pech des Treilles, 82240 Puylaroque, France

[21] Appl. No.: 872,460

[22] Filed: Jan. 25, 1978

Related U.S. Application Data

[63] Continuation-in-part of Ser. No. 678,743, Apr. 21, 1976, abandoned.

[30] Foreign Application Priority Data

May 25, 1977 [FR] France .................................. 77 15937

[51] Int. Cl.³ .............................................. G01D 5/34
[52] U.S. Cl. ................................... 250/229; 338/32 R
[58] Field of Search .................... 338/2, 5, 32 R, 32 S, 338/114; 335/207, 170; 250/229; 340/365 R, 365 L, 365 P; 200/44, 46; 46/236

[56] References Cited

U.S. PATENT DOCUMENTS

| | | | |
|---|---|---|---|
| 3,017,463 | 1/1962 | Dinsmore et al. | 340/365 P |
| 3,184,882 | 5/1965 | Vega | 46/25 |
| 3,336,482 | 8/1967 | Mierendorf et al. | 250/229 |
| 3,454,920 | 7/1969 | Mehr | 338/5 |
| 3,774,198 | 11/1973 | Takeda et al. | 338/32 H |
| 3,858,145 | 12/1974 | Sulich et al. | 338/32 R |
| 4,054,860 | 10/1977 | Henderson et al. | 338/32 H |

*Primary Examiner*—David C. Nelms
*Attorney, Agent, or Firm*—Haseltine & Lake

[57] ABSTRACT

Push-button movable in a casing for switching an electric circuit and comprising magnetic return means and contact elements carried by the casing, said contact elements being electric or electronic components adapted to pass individually from a first conducting state to a second conducting state when the push-button is moved from a first position to a second position within the casing.

12 Claims, 11 Drawing Figures

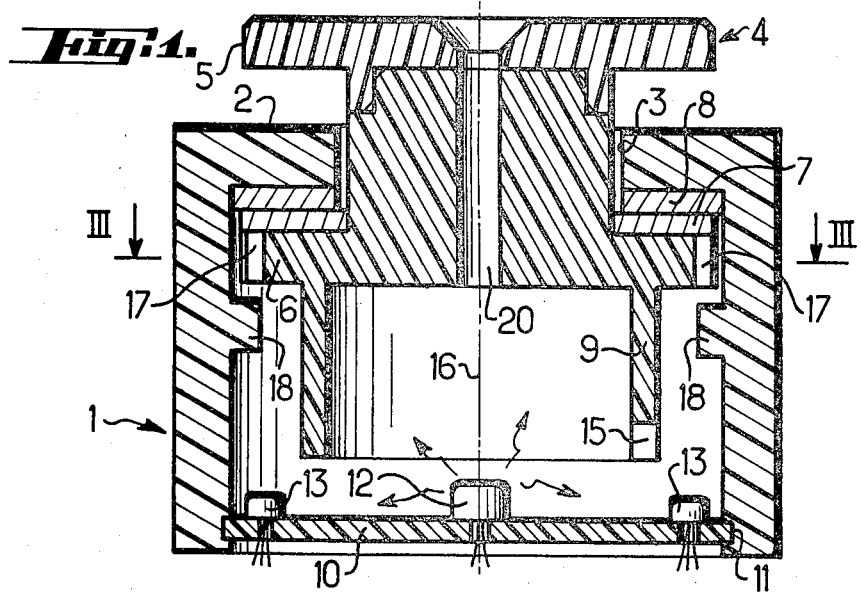
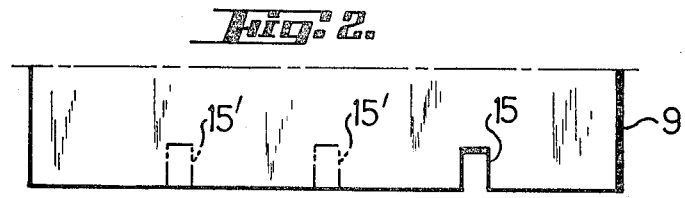
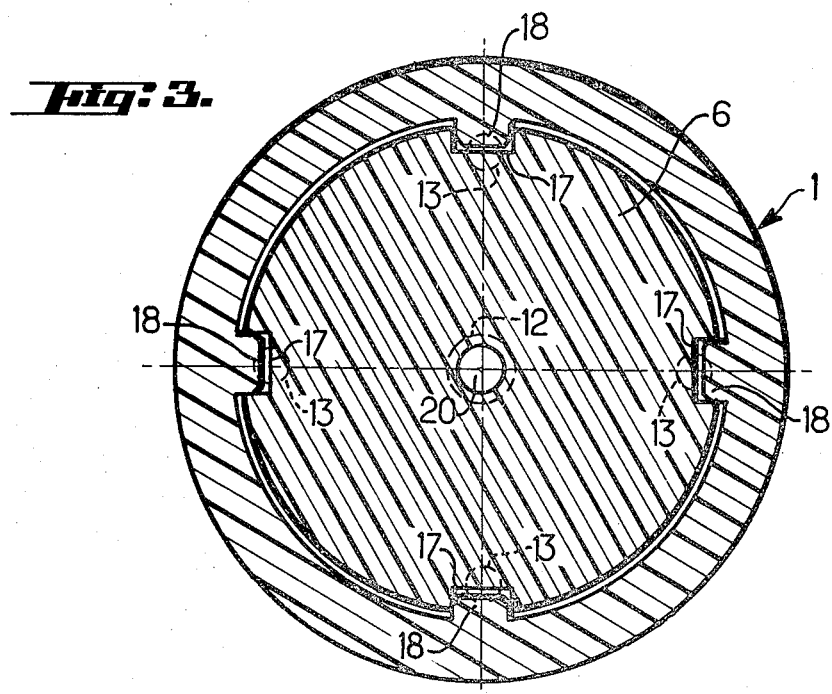

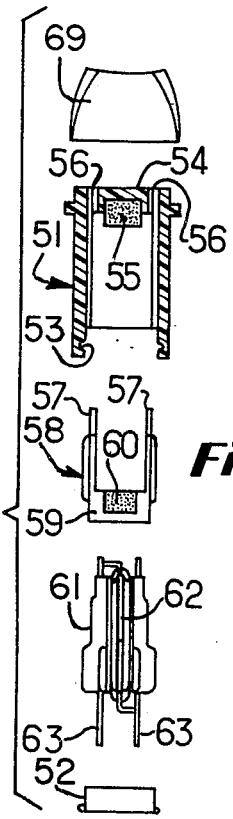
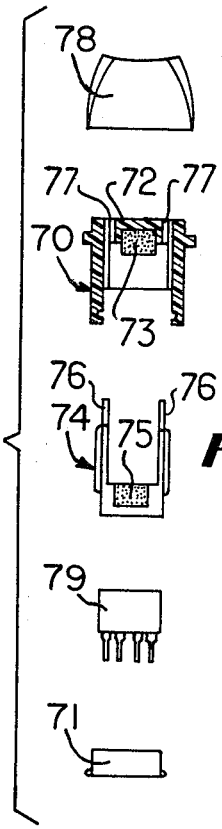
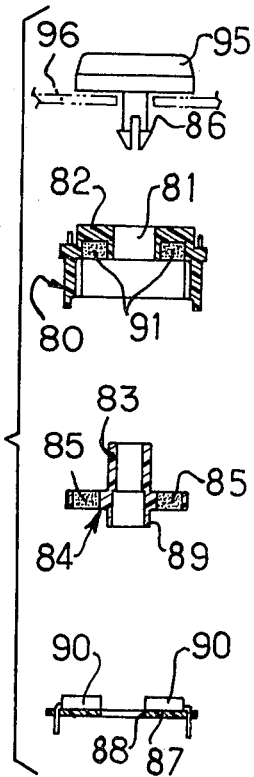
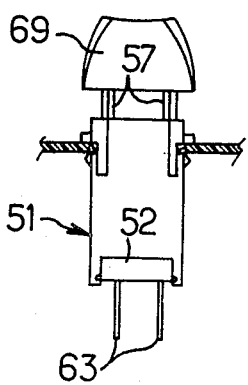
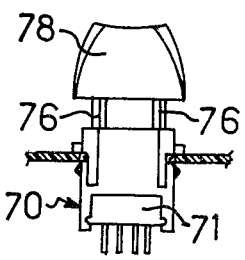
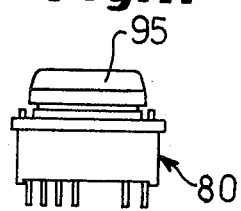

CONTROL PUSH-BUTTON DEVICE FOR SWITCHING AN ELECTRONIC OR ELECTRIC CIRCUIT

The present invention is a continuation-in-part of U.S. patent application Ser. No. 678,743 filed on Apr. 21, 1976, now abandoned.

The invention relates essentially to a control pushbutton device for switching at least one electric or electronic circuit.

There is already known an improved push-button such as the one described in French patent application No. 7301053, which comprises a casing, a push-button which is movable by being pressed through an opening through one face of the casing between two positions corresponding respectively to two distinct states of switching of an electric circuit, and magnetic means for the return of the push-button accomodated in the casing. The casing face opposite the opening through which the push-button passes is constituted by a detachable plate of insulating material supporting connecting terminals, contact makers and contact reeds, some of which are movable and driven in displacement by the said push-button. The latter is provided in its portion within the casing with a disk or washer of magnetic material co-operating with at least one permanent magnet integral with the casing to form magnetic return means.

This improved push-button already offered a certain number of advantages over the push-buttons known earlier, such as insensitivity to the technical and climatic environment, the elimination of fatigue phenomena in the springs or the resilient membranes, the prevention of corrosion effects, etc.

However, owing to the fact that the contacts used in the push-button were mechanical, the closing and opening of the contacts, which took place by means of resiliently deformable conducting reeds, resulted in rapid transient voltage oscillations before the setting off of stable conditions corresponding to the closing or the opening of the contacts, respectively. When such a push-button was used in very-quick-action electronic circuits, it was necessary to provide pulse shaping circuits between the outputs of the push-button and the corresponding electronic circuit.

The present invention has precisely for its purpose to eliminate this drawback and provides to this end a control device for switching at least one electric or electronic circuit, comprising a casing, a push-button movable through an opening in one face of the casing between two positions each of which corresponds to a switching state of the said circuit, magnetic means for returning the push-button to one of the two said positions, constituted by a plate or a washer of magnetic material and a permanent magnet one of which is placed on the said button whereas the other is secured to the casing, the latter being closed, at its end opposite the said face traversed by the push-button, by a detachable plate of insulating material on which are provided the necessary contact elements, characterized in that the said contact elements are electric or electronic components, such as photoreceivers associated with photoemitters, and Hall-effect elements, so arranged on the said plate as to individually pass from a first conducting state corresponding to a first switching state of the said circuit, to a second conducting state corresponding to the second switching state of the said circuit when the said push-button is displaced from one of its positions to the other, the outputs of the said contact elements being connected directly to circuits for the switching of the said electric or electronic circuit.

Thus, the use of such electric or electronic components as contact elements allows to dispense with the shaping circuits usually provided between the outputs of the push-button and the associated electronic circuit. This feature of the invention therefore results in considerable economy from the point of view of the materials, the manufacturing costs as well as the space occupied by the circuits. According to the invention, this economy is due to the elimination of the transient phenomena attending the making and breaking of the contacts, which resulted from the use of purely mechanical contact elements.

According to another feature of the invention, the push-button in its rest or stable position is movable in rotation about its longitudinal axis and can be moved to certain predetermined angular positions each of which corresponds to the selection of a predetermined combination of conducting states of the said contact elements, the push-button being adapted to be pressed into the said second position only when, in the said rest position, it occupies one of the said predetermined angular positions.

There is thus advantageously obtained, by means of a simple push-button according to the invention, a coding device allowing a predetermined information to be selected by rotating the button, and thereafter, by pressing the button, in allowing the said information to be validated by means of a pulse of very short duration corresponding to a predetermined combination of the conducting states of the contact elements.

It is therefore understood that the device according to the invention can be highly useful in a number of quite extensive technical fields.

The invention will be better understood and other purposes, features and advantages of the latter will appear more clearly from the following explanatory description, with reference to the appended diagrammatic drawings given solely by way of example illustrating two forms of embodiment of the invention and wherein:

FIG. 1 is a longitudinal axial section of a push-button according to the invention, comprising photoreceivers associated with a photoemitter;

FIG. 2 is a developed view of the internal tubular cyclindrical portion of the push-button, adapted to selectively cover or uncover the photoreceivers;

FIG. 3 is a cross-sectional view upon the line III—III of the push-button shown in FIG. 1;

FIG. 6 is an exploded view of a third form of embodiment of a device according to the invention;

FIG. 7 is an external view of the device of FIG. 6 in the assembled state;

FIG. 8 is an exploded view of a fourth form of embodiment of a device according to the invention;

FIG. 9 is an external view of the device of FIG. 8 in the assembled state;

FIG. 10 is an exploded view of a fifth form of embodiment of a device according to the invention; and FIG. 11 is an external view of the device of FIG. 10 in the assembled state.

Figure 4:
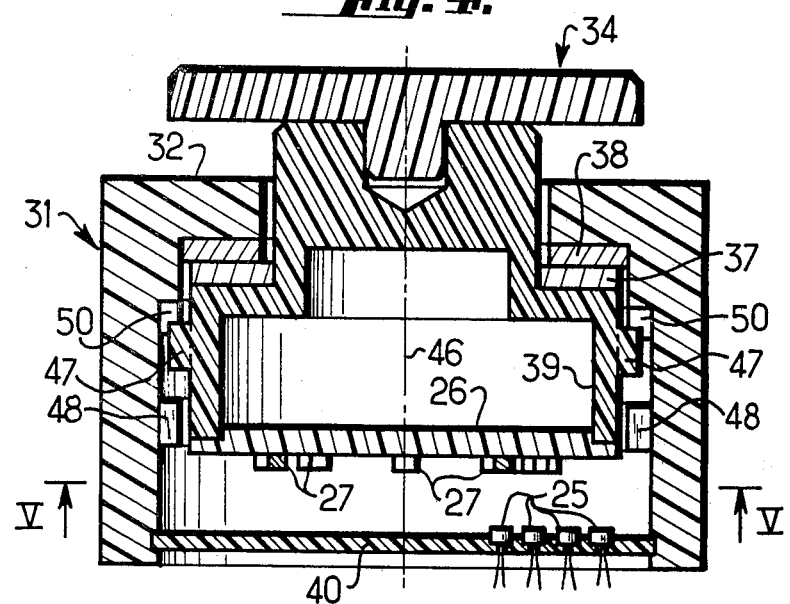
FIG. 4 is an axial longitudinal sectional view of a modified form of embodiment of the push-button according to the invention, in which the contact elements are resiliently deformable insets or pellets forming variable resistors, variable capacitors or Hall-effect elements.

In FIG. 1 is therefore diagrammatically illustrated, in axial section, a device according to the invention which comprises a casing 1 of insulating material, e.g. a plastic material which in this case is substantially cylindrical tubular in shape. The casing 1 is provided at one of its ends with an annular flange 2 with a circular opening 3 through which passes a push-button 4, the head 5 of which is greater in diameter than the opening 3. The push-button 4 extends within the casing and comprises an annular shoulder or projection 6 carrying a washer or ring 7 of magnetic or ferromagnetic material which co-operates with an annular permanent magnet 8 secured to the flange 2 of the casing. The push-button 4 terminates, at its end opposite the head 4, in a cylindrical skirt portion 9, the end of which is intended to contact a plate 10 of insulating material closing the open end of the casing 1 opposite the flange 2, for example by being set in an annular slot 11 or by being assembled to the casing by any other means.

The plate 10 of insulating material supports all the necessary contact elements, which, in this case, are for example a photoemitter 12 such as an electroluminescent diode, and photoreceivers 13, for example four in number, which may be phototransistors. The plate 10 may be coated on any one or both of its faces with an electroconducting printed circuit.

The contact elements constituted by the photoemitter 12 placed at the centre of the plate and the photoreceivers 13 placed on the periphery of the said plate, are mounted on the inner face of the plate 10 and are connected, on the outer face of the latter, to a supply circuit and to an electric or electronic circuit, the switching of which is controlled by the device according to the invention.

In the form of embodiment illustrated and as appears more clearly from FIG. 2, the cylindrical skirt portion 9 of the push-button is provided with a cut 15 extending over a certain height from the end of the skirt portion 9 which is opposite the plate 10. The cut 15 is intended, when the push button is pushed in by pressing on its head 5, to be brought between the photoemitter 12 and a photoreceiver 13.

The push-button according to the invention is also provided with means for angular positioning in a certain number of predetermined angular positions about its longitudinal axis 16. In the case considered, the said predetermined angular positions are four in number and the periphery of the angular projection or shoulder 6 of the push-button is provided with four grooves 17 separated from one another by an angle of 90 deg. The internal surface of the cylindrical portion of the casing 1 is provided with four splines 18, also distributed 90 deg. apart from one another and shifted in height with respect to the grooves 17 of the push-button, so that when the latter is in its rest position shown in FIG. 1, the grooves 17 are withdrawn from the splines 18 and are located above the latter. In this position, the push-button is therefore free to rotate about its longitudinal axis 16.

The head 5 of the push-button may be provided with a reference mark which, when the push-button 4 is rotated in its rest position about its axis 16, may be brought opposite four reference marks provided on the annular flange 2 of the casing 1. This feature thus allows a predetermined combination to be selected by placing the cut 15 in front of a predetermined photoreceiver 13. In this predetermined angular position of the push-button 4 about its axis 16, the grooves 17 are exactly aligned with the corresponding splines 18 of the casing 1, so that the push-button may then be pressed in to be brought into contact with the insulating plate 10 by simply pressing on its head 5.

The operation of this control device according to the invention is therefore as follows.

The photoemitter 12 is supplied permanently, and when the push-button 4 is in the rest position shown in FIG. 1, under the action of the aforesaid magnetic return means 7 and 8, all the photoreceivers 13 are exposed to the radiation of the photoemitter 12 and therefore have a conducting state which will be referred to as "0". By rotating the push-button 4 about its axis 16 when the said push-button is in its rest position, a predetermined information is selected. The latter is validated when the push-button 4 is pushed in till its cylindrical skirt portion 9 bears upon the plate 10. At that moment, the cut 15 is located opposite one of the said photoreceivers 13, which photoreceiver retains its conducting state "0". All the other photoreceivers 13 are no longer subjected to the radiation of the photoemitter 12, which is intercepted by the cylindrical skirt portion 9, and therefore pass into a conducting state "1". There theredore occurs a change from a combination of conducting states "0-0-0-0" of the photoreceivers 13 when the push-button 4 in its rest position, into a combination of conducting states "1-1-1-0-" when the push-button 4 is in its working position. By rotating the push-button 4 about its axis 16, the other following combinations of conducting can be obtained: "1-1-0-1", "1-0-1-1", "0-1-1-1".

It is quite obvious, on the other hand, that several cuts 15 may be provided in the cylindrical skirt portion 9 of the push-button and that the arrangement of such cuts may vary. There may be provided, as shown by way of example in FIG. 2, a cylindrical skirt portion 9 provided with two cuts 15' shown in phantom lines. There may also be provided a skirt portion 9 having three cuts 15, forms by the two cuts 15' shown in phantom lines and the cut 15 shown in full lines.

It will be noted that the body of the push-button 4 may be provided with a cylindrical bore 20 leading from the internal space of the skirt portion 9 to the outer face of the head 5, the said cylindrical bore 20 allowing a portion of the radiation emitted by the photoemitter 12 to be intercepted to illuminate the upper face of the push-button head 5. A set of optical fibres may also be arranged in the bore 20 to illuminate the upper face of the head 5 with a predetermined pattern.

Likewise, the push-button 4 may be provided with means allowing it to be immobilized in rotation, in its position of rest, when it is in one of the predetermined angular positions corresponding to the selection of an information. These means may consist of splines identical with the splines 18 of the casing, but located above the grooves 17 of the push-button, for example as shown in the form of embodiment of FIG. 4, or radial splines on the lower face of the element 8 co-operating with radial slots on the upper face of the washer 7 of magnetic material.

The push-button 4 can thus be positioned automatically and with no risk of error in one of its predetermined angular positions.

Figure 5:
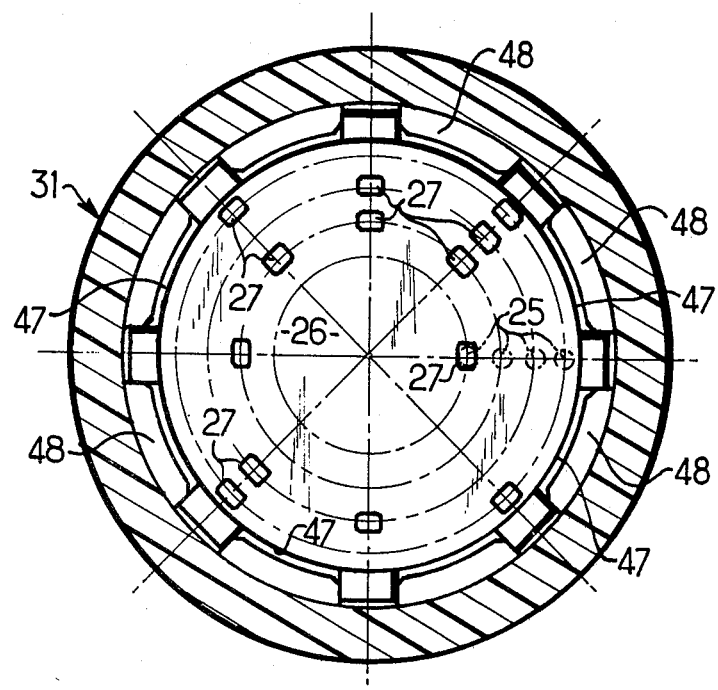
FIG. 5 is a sectional view upon the line V—V of the button shown in FIG. 4.

FIGS. 4 and 5 illustrate a modified form of embodiment of the device according to the invention, in which the photoemitters and the photoreceivers are replaced by variable resistors, variable capacitors, and/or Hall-effect elements. The said resistors, capacitors or elements are in the form of insets or pellets which are resiliently deformable by compression, the compression of which results in an abrupt change in resistance, capacitance or voltage, respectively.

The push-button shown in FIGS. 4 and 5 therefore comprises, as previously, a casing 31 having an upper annular flange 32 through which passes a push-button 34. The opposite face of the casing 31 is closed by an insulating plate 40 provided with contact elements 25 which may be accommodated in small cavities of the inner face of the plate 40 so as to project from the latter by a height corresponding to the normal collapse of the pellets resulting in the aforesaid abrupt change in resistance, capacitance or voltage.

As previously, the button 34 terminates, opposite the plate 40, in a cylindrical skirt portion 39 receiving at its end a closing plate 26, whose face opposite the plate 40 and the pellets 25 is provided with a certain number of projecting contact pieces or magnets 27 arranged in concentric circle according to the drawing shown in FIG. 5.

As in the previous form of embodiment, the inner wall of the casing comprises splines 48 adapted to cooperate with grooves 47 provided on the outer surface of the cylindrical skirt portion 39 and defining the various predetermined angular positions of the push-button 34 with respect to its longitudinal axis 46. The inner wall of the casing 31 is also provided with a series of splines 50, aligned with the said splines 48, arranged above the latter and apart therefrom, so that when the push-button 34 is slightly pressed in it can rotate freely between the splines 48 and 50. In another manner, the splines and the corresponding slots may be formed radially on the lower face of the magnet 38 secured to the casing 31 and radially on the upper face of the washer 37 of magnetic material secured to the push-button 34. The edges of these splines and slots may be flared so as to allow the push-button 4 to be gently positioned in one of its predetermined angular positions about its axis 46, in such a manner that the push-button may be moved from one angular position to another without modifying the conducting states of the elements 25, by rotation without exerting an important pressure along the axis 46.

As appears clearly from FIG. 5, the contact element 25 are aligned along one and the same radius, and the contact pieces or magnets 27 of the lower surface of the plate 26 of the push-button 34 are suitably distributed on four concentric circumferences, each of which passes through a contact element 25. The push-button 34 may occupy eight distinct angular positions equidistant from one another about the axis 46, and each of the said angular positions corresponds to a predetermined combination of the conducting states of the four elements 25. Designating by "0" the conducting state of an element 25 when the push-button 34 is in its rest position shown in FIG. 4, and by "1" the conducting state of an element 25 when it is engaged or collapsed by a predetermined amount by a contact piece 27, the following combinations of conducting states are obtained depending on the predetermined angular position occupied by the push-button 34:

| Positions of the button 34 | State of contact elements 25 | | | |
|---|---|---|---|---|
| 1 | 0 | 0 | 0 | 1 |
| 2 | 0 | 0 | 1 | 0 |
| 3 | 0 | 0 | 1 | 1 |
| 4 | 0 | 1 | 0 | 0 |
| 5 | 0 | 1 | 0 | 1 |
| 6 | 0 | 1 | 1 | 0 |
| 7 | 0 | 1 | 1 | 1 |
| 8 | 1 | 0 | 0 | 0 |

The state "0-0-0-0" of the contact elements 25 corresponding to the rest position of the push-button 34.

It is therefore sufficient, according to the invention to select a predetermined combination of the conducting states of the contact elements 25, by rotating the push-button 34 about its axis 46 when it is in position of rest, then to push the button in when it is brought to the predetermined position, in order to validate the selected combination.

It is quite obvious that a great number of variants may be introduced into the forms of embodiment just described without departing from the scope of the invention. In particular the cuts 15 of the cylindrical skirt portion 9 of the push-button shown in FIG. 1 may be replaced by reflecting regions, or by opaque regions respectively, with an appropriate arrangement of the photoemitters and the photoreceivers.

Use may also be made of the magnetic means for the return of the push-button to its rest position as means of angular positioning of the button, for example by arranging a series of small permanent magnets on the internal annular face of the flange 2 (or 32) of the casing, by orienting all of them in one and the same manner and by distributing them equidistantly from one another, and by arranging small magnets on the annular flange of the push-button (instead of the washers 7 or 37) which are so oriented that the magnetic attraction between the magnets of the casing and those of the button returns the said button to its position of rest, on the one hand, and positions angularly the button about its axis, on the other hand.

Lastly, it will be noted that the use of the photoreceivers or variable resistors, capacitors or the Hall-effect elements allows the shaping and amplifying circuits to be dispensed with, the difference of the output levels corresponding to the two conducting states of these contact elements being sufficiently important to be applied directly to switching circuits, triggering circuits or logic circuits.

There are thereafter shown in FIGS. 6 to 11 three other forms of embodiment of a device according to the invention, using as electric or electronic components Hall-effect elements or movable contact-reed bulbs.

FIG. 6 is an exploded view of the various component elements of a device according to the invention, using one or two movable contact-reed bulbs.

The device of FIG. 6 comprises a casing 51 of plastics material, the bottom of which is open and which is intended to be closed by a bottom plate 52 pressed into resilient engagement with a groove 53 provided in the lower walls of the casing 51. The horizontal upper portion 54 of the casing is closed and supports within the casing a small permanent magnet 55 or a mild or soft iron plate. The upper face 54 of casing 51 is also provided with two lateral openings 56 allowing the passage of the two side legs 57 of a plunger 58 intended to form with a knob 69 the movable push-button within the casing 51. The lower transverse portion 59 of the plunger 58 carries a permanent magnet 60 presenting for example on its upper face a S magnetic pole when the permanent magnet 55 of casing 51 presents on its lower face a N magnetic pole.

The device also comprises a flat or U-shaped element 61 intended to support one or two switching elements 62 which, here, consist of movable contact-reed bulbs. Such contact bulbs are well known in the art, and are constituted by a small evacuated and sealed bulb within which extend two contact reeds which are normally slightly spaced from one another. Such contact reeds are arranged to apply on one another under the action of an external magnetic field.

The element 61 carrying the bulbs 62 also comprises two longitudinal contact pins 63 for each bulb, one of the said pins being connected to one of the contact reeds of the bulb and the other pin being connected to the other contact reed as shown in the drawing. The lower contact pins 63 of element 61 pass through the bottom plate 52 as seen particularly in FIG. 7.

The assembling of the device is performed as follows: the plunger 58 is introduced into the casing 51 so that the legs 57 pass through the openings 56 of the upper portion 54 of casing 51. The knob 69 is then mounted on the end of the lateral legs 57 of the plunger 58 by being fitted thereon by force or resiliently. The element 61 carrying the contact bulb or bulbs 62 is thereafter so mounted within the casing 51 as to, in a way, straddle the plunger 58. The bottom plate 52 is thereafter pressed into resilient engagement with the bottom of casing 51.

The operation of the device is as follows: when no external action is exerted on the device, the plunger 58 is in its upper position or position of rest within the casing 51, the plunger magnet 10 being applied on the casing magnet 55 or the soft-iron plate 55 of the casing with no clearance therebetween. In that position the magnet 60 of plunger 58 is located above the bulbs 62 and its magnetic field does not act upon the contact reeds of the bulbs. Each of the latters therefore constitutes a switch which is in a given switching state, the circuit being either open or closed.

When a user depresses the knob 69, the plunger 58 within the casing 51 moves down into abutment against either a portion of the element 61 or the bottom plate 52, and the magnet 60 is thus moved to a position where it acts upon the movable contact reeds of the bulbs 62 to change the conducting state, the switches formed by the bulbs 62 then becoming open or closed as the case may be.

It is therefore understood that the device according to the invention illustrated in the drawings is made up essentially of a casing and of a movable plunger equipped with permanent magnets. The plunger is kept in its upper position or position of rest by the attraction of both magnets, which are then applied on one another with no clearance therebetween, so that the device offers very good vibration and impact behaviour, with, in particular, an acceleration withstanding aptitude of the order of 50 g, and exhibits no resonant frequency.

In order to depress the push-button, it is sufficient to exert on the knob 69 a greater force than the magnetic attraction of the magnets 55 and 60, the depressing of the plunger 58 having a contrary characteristic to that of a spring, for the depressing effort decreases rapidly as a function of the travel, so that the effort exerted on the knob 69 to keep the plunger 58 in its lower working position is very small, which makes it impossible not to depress the plunger down to the end of its travel once a slight depressing has already commenced.

It will be pointed out, by way of example, that in a device of the type described with reference to FIGS. 6 and 7, the maximum travel of the plunger is 5 mm, the depressing force is about 80 g, the return force exerted on the plunger in its working position is 5 g.

FIGS. 8 and 9 illustrate a fourth form of embodiment of the device according to the invention, using Hall-effect elements as switching elements.

The casing 70 of this device is substantially identical with, but shorter than, the casing 51 of the third form of embodiment. It is intended to be closed at its bottom by a bottom plate 71 and is provided in its upper portion 72, on its lower face, with a permanent magnet 73 or a mild- or soft-iron plate. The plunger 74 is identical with that of the third form of embodiment and comprises in its lower portion a permanent magnet 75. The plunger 74 is U-shaped and its two lateral legs 76 are intended to pass through openings 77 provided in the upper portion 72 of the casing 70. A knob 78 is adapted to be mounted on the end of the lateral legs 76 of the plunger 74.

The bottom plate 71 is intended to carry one or two Hall-effect integrated circuits 79, the connecting pins of which pass through the plate 71 as shown in FIG. 9. Such Hall-effect elements are well known in the art, and it is known that their conducting state is changed when an external magnetic field acts thereon. In the case considered, it is the magnetic field of the magnet 75 that will act upon the elements 79 to switch the same.

The assembling and operation of the device illustrated in FIGS. 8 and 9 are substantially identical with those of the device shown in FIGS. 6 and 7. To assemble the device, it is sufficient to introduce the plunger 74 into the casing 70, to mount the knob 78 on the lateral legs 76 and to mount the bottom plate 71 carrying the integrated circuit 79 within the casing 70 by resilient engagement.

When the knob 78 is not depressed, the plunger 74 is in its upper position or position of rest, the magnet 75 being applied on the magnet or the mild-iron plate 73. When the knob 78 is depressed with a greater force than the magnetic attraction force between the elements 73 and 75, the plunger 58 moves down into abutment against the bottom plate 71, the magnet 75 then being placed substantially in contact with the elements 79, or in the immediate vicinity thereof. The magnetic field of magnet 75 then causes the switching of the element 79.

In the form of embodiment of FIGS. 10 and 11, the device according to the invention also comprises Hall-effect elements as switching elements, but the shape of the casing and the plunger is slightly different.

In this form of embodiment, the casing 80 is provided with a central hole 81 in its upper portion 82, which hole allows for the passage of the upper portion 83 of plunger 84. The latter is substantially cross-shaped in section and comprises two transvere legs each carrying a permanent magnet 85. The plunger 84 in conjunction with the knob 95 constitutes the push-button proper, the knob 95 being resiliently engaged through the medium of two tongues 86 within the hollow portion 83 of plunger 84.

The bottom of the casing 80 is closed by a bottom plate 87 which may be provided at its centre with a hole 88 allowing for the passage of the lower portion 89 of the plunger 84 when the latter is in its lower or working position, this plate 87 being also intended to carry one or two Hall-effect integrated circuits 90 mounted on the plate 87 as shown in the drawings.

The mounting and assembling of this device are performed as in the foregoing forms of embodiment, i.e. the plunger 84 is placed within the casing 80, its upper portion 83 passing through the hole 81, the knob 95 is resiliently fitted onto the plunger 84, then the bottom plate 87 is secured on the bottom of the casing 80, the integrated circuits 90 being thus located within the casing.

When the knob 95 is not acted upon, the plunger 84 is in its upper or rest position, the magnets 85 being applied on the magnets or mild-iron plates 91 carried by the lower portion 82 of the casing. When the knob 95 is depressed with a greater force than that of the magnetic attraction between the magnets 85 and the magnets or mild-iron plates 91, the plunger 84 moves down within the casing 80 until the magnets 85 are substantially in contact with the integrated circuits 90, the magnetic field of the magnets 85 causing the switching of the said integrated circuits.

When the pressure exerted on the knob 95 is removed, the plunger 84 moves upward to its position of rest under the action of the return force exerted between the magnets 85 and the magnets or mild-iron plates 91.

It is of course understood that a number of modifications may be introduced into the invention without departing from the scope of the requested protection. In particular, the bottom plates closing the casings may carry one, two or several switching elements such as Hall-effect integrated circuits or sealed, movable contact-reed bulbs constituting switches. It is also very easy to make the devices according to the invention tight, in particular to dust and humidity. It is sufficient, to that end, to place a sheet 96 of flexible and tight material, e.g. a sheet of rubber, between the knob 95 and the associated plunger.

It is also possible to provide, on the bottom plate, an electroluminescent or light-emitting diode associated with a small resistor, light-emission by the diode being brought about by the plunger in its lower working position and allowing the upper portion, or a particular region, of the knob to be illuminated when the knob is depressed.

It is therefore understood that the invention is by no means limited to the forms of embodiment described and illustrated which have been given by way of example only, and it comprises in particular all means constituting technical equivalents to the means described as well as their combinations should the latter be carried out according to its gist and used within the scope of the following claims.

What is claimed is:

1. A push-button switch, comprising a casing provided with an opening, a push-button movable through said opening between a first and a second end positions in the casing, a plate of insulating material forming a wall of the casing and carrying at least one switching means adapted to pass from a first conduction state to a second conduction state when submitted to a magnetic field, at least an element of magnetic material secured to said casing, and at least a permanent magnet carried by said push-button for controlling the conduction state of the switching means when the push-button is in its second end position and for forming with said element of magnetic material magnetic return means for returning the push-button it its first end position.

2. A push-button switch according to claim 1, wherein, in the first end position of the push-button, the permanent magnet is substantially applied on the element of magnetic material, and in the second end position of the push-button, the permanent magnet is in the immediate vicinity of the switching means.

3. A push-button switch according to claim 1, wherein the plate carrying the switching means is substantially opposite to the said opening.

4. A push-button switch according to claim 1, wherein the said plate carries several switching means.

5. A push-button switch according to claim 1, wherein the switching means comprise at least one contact-reed bulb.

6. A push-button switch according to claim 1, wherein the switching means comprise at least one Hall effect element.

7. A push-button switch according to claim 1, wherein the said plate carries luminous signalling means operated when the push-button is in its second end position.

8. A push-button switch according to claim 1, wherein the push-button comprises a plunger located within the casing and an external knob located outside the casing and removably mounted on the plunger.

9. A push-button switch according to claim 8, wherein the plunger has a U-shape and comprises two legs extending through an upper portion of the casing and a transverse part carrying said at least one permanent magnet.

10. A push-button switch according to claim 8, wherein the plunger in the shape of a cross having two lateral branches each carrying a permanent magnet.

11. A push-button switch according to claim 1, wherein the element of magnetic material is a permanent magnet.

12. A push-button switch according to claim 8, further comprising a sheet of flexible and tight material interposed between said external knob and said plunger.

* * * * *